United States Patent [19]
Myer

[11] Patent Number: 6,052,023
[45] Date of Patent: Apr. 18, 2000

[54] CALIBRATION SYSTEM FOR FEED FORWARD DISTORTION REDUCTION SYSTEM

[75] Inventor: Robert Evan Myer, Denville, N.J.

[73] Assignee: Lucent Technologies Inc., Murray Hill, N.J.

[21] Appl. No.: 09/144,018

[22] Filed: Aug. 31, 1998

[51] Int. Cl.[7] .............................. H03G 3/30; H03F 3/66
[52] U.S. Cl. ................... 330/2; 330/52; 330/151
[58] Field of Search ............................. 330/52, 151, 149, 330/2

[56] References Cited

U.S. PATENT DOCUMENTS

| | | | |
|---|---|---|---|
| 3,922,617 | 11/1975 | Denniston et al. | 330/149 |
| 4,580,105 | 4/1986 | Myer | 330/149 |
| 4,583,049 | 4/1986 | Powell | 330/151 |
| 4,885,551 | 12/1989 | Myer | 330/52 |
| 4,926,136 | 5/1990 | Olver | 330/149 |
| 5,012,490 | 4/1991 | Myer | 375/58 |
| 5,166,634 | 11/1992 | Narahashi et al. | 330/151 |
| 5,304,945 | 4/1994 | Myer | 330/149 |
| 5,307,022 | 4/1994 | Tattersall, Jr. et al. | 330/52 |
| 5,430,893 | 7/1995 | Myer | 455/209 |
| 5,455,537 | 10/1995 | Larkin et al. | 330/52 |
| 5,508,657 | 4/1996 | Behan | 330/151 |
| 5,515,000 | 5/1996 | Maruyama et al. | 330/52 |
| 5,610,554 | 3/1997 | Anvari | 330/52 |
| 5,619,168 | 4/1997 | Myer | 330/149 |
| 5,847,603 | 12/1998 | Myer | 330/52 |

Primary Examiner—Robert Pascal
Assistant Examiner—Khanh Van Nguyen
Attorney, Agent, or Firm—Julio A. Garceran

[57] ABSTRACT

A calibration system for a feed forward distortion reduction system periodically uses a pilot signal to calibrate the pilotless feed forward reduction system. In calibrating the feed forward distortion reduction system, the calibration system periodically injects the pilot signal onto a signal path, for example, when no signal is present on the signal path. A portion of the pilot signal on the signal path is provided to a feed forward path of the feed forward distortion reduction system. The pilot signal on the feed forward path is combined with the pilot signal on the signal path, and the calibration system adjusts the relative phase and amplitude between the pilot signal on the feed forward path and the pilot signal on the signal path to achieve the desired combination of the pilot signals. Thus, the calibration system calibrates the feed forward distortion reduction system to provide improved combination of the pilot signals, thereby improving the distortion reduction for the feed forward distortion reduction system.

13 Claims, 1 Drawing Sheet

CALIBRATION SYSTEM FOR FEED FORWARD DISTORTION REDUCTION SYSTEM

BACKGROUND OF THE INVENTION

1. Field of the Invention

This invention relates to amplifiers and, more particularly, to a calibration system for a feed forward distortion reduction system.

2. Description of Related Art

Amplifiers often add undesired distortion to a signal, creating an output signal comprising distortion or nonlinear components and the input signal component. The distortion includes any undesired signals added to or affecting adversely the signal. There is therefore a need to devise techniques that can eliminate substantially or reduce significantly the distortion produced by the amplifier.

Feed-forward correction is routinely deployed in modern amplifiers to improve amplifier linearity with various input patterns. The essence of the feed-forward correction is to manipulate distortion, such as intermodulation (IMD) components, created by the amplifier so that at the final summing point, the distortion cancels out. Due to the unpredictability of the input signal pattern as well as the resultant distortion location, some feed forward schemes inject a known signal, i.e. a pilot signal, in the main signal path to mimic the distortion produced by the amplification process. In feed-forward amplifiers, the feed forward distortion reduction circuitry minimizes the pilot along with the distortion. As such, by designing the feed forward distortion reduction circuitry to detect and cancel the pilot, the distortion can also be removed.

The output of the feed forward amplifier system contains the reduced pilot signal which is detected using detection circuitry to provide information to the feed forward distortion reduction circuitry to improve cancellation of the pilot signal at the output. The information obtained from detecting the pilot signal at the output of the feed forward distortion reduction circuitry can also compensate for changes in the operation of individual components of the feed forward distortion reduction circuitry. In actual systems, however, there is rarely an absolute cancellation of the distortion and the pilot signals. Feed forward distortion reduction systems require tight operating tolerances, for example, to achieve a 30 dB reduction in IMDs, typical feed forward correction systems may require a + or −0.1 dB frequency flat response (amplitude deviation over the frequency band of operation) and a + or −1 degree phase linearity (phase deviation from a straight line in the frequency band of operation). To obtain this accuracy is difficult.

The amplitude of the pilot signal is typically relatively small at the output of the feed forward distortion reduction system because of the cancellation of the pilot and the relative amplitude of the pilot signal with respect to the amplitude of the output signal. Thus, it becomes difficult to detect the pilot signal at the output of the system. To improve detection of the pilot signal at the output of the correction circuitry, schemes are developed to place the pilot signal at an appropriate location and to improve detection.

Pilotless feed forward distortion reduction schemes have been developed to eliminate the need for a pilot signal. The pilotless feed forward reduction schemes, however, do not have a known pilot signal which can be detected at the output of the feed forward distortion reduction system which can be used to compensate for changes in the operation of the feed forward reduction circuitry. As such, pilotless feed forward reduction circuitry can degrade in performance as individual components exhibit changing operating characteristics, for example, due to aging or temperature change.

A need exists for a calibration system for feed forward distortion reduction systems to improve distortion reduction.

SUMMARY OF THE INVENTION

The present invention involves a calibration system for a feed forward distortion reduction system which periodically uses a pilot signal to calibrate the feed forward reduction system. In calibrating the feed forward distortion reduction system, the calibration system periodically injects the pilot signal onto a signal path, for example, when no signal is present on the signal path. A portion of the pilot signal on the signal path is provided to a feed forward path of the feed forward distortion reduction system. The pilot signal on the feed forward path is combined with the pilot signal on the signal path, and the calibration system adjusts the relative phase and amplitude between the pilot signal on the feed forward path and the pilot signal on the signal path to achieve the desired combination of the pilot signals. Thus, the calibration system calibrates the feed forward distortion reduction system to provide improved combination of the pilot signals, thereby improving the distortion reduction for the feed forward distortion reduction system.

For example, during normal operation of a pilotless feed forward distortion reduction system, the system receives a signal to be amplified on a main signal path and replicates the signal onto a main signal path and a feed forward path. The signal on the main signal path is applied to a gain & phase circuit. The output of gain & phase circuit is applied to the amplifier whose output comprises the amplified signal and distortion produced by the amplifier on the main signal path. A portion of the output of the amplifier is placed on a coupling path and combined with a delayed version of the signal on the feed forward path to isolate the distortion produced from the amplifier. The gain & phase circuit is controlled to adjust the gain and phase of the signal to be substantially the inverse (equal in amplitude but 180° out of phase) of the delayed signal on the feed forward path. The distortion on the feed forward path is adjusted by a gain and phase circuit on the feed forward path, and the resulting distortion on the feed forward path is used to reduce the distortion on the main signal path. Because a pilot signal is not injected into the main signal path along with the signal and detected at the output of the pilotless feed forward correction circuitry, changes in the operation of devices in the feed forward correction system can cause a degradation in distortion reduction performance. As such, the calibration system can periodically inject a pilot into the main signal path and calibrate the pilotless feed forward correction circuitry based on measurements of the pilot signal.

BRIEF DESCRIPTION OF THE DRAWINGS

Other aspects and advantages of the present invention may become apparent upon reading the following detailed description and upon reference to the drawings in which.

DETAILED DESCRIPTION

Figure 1:
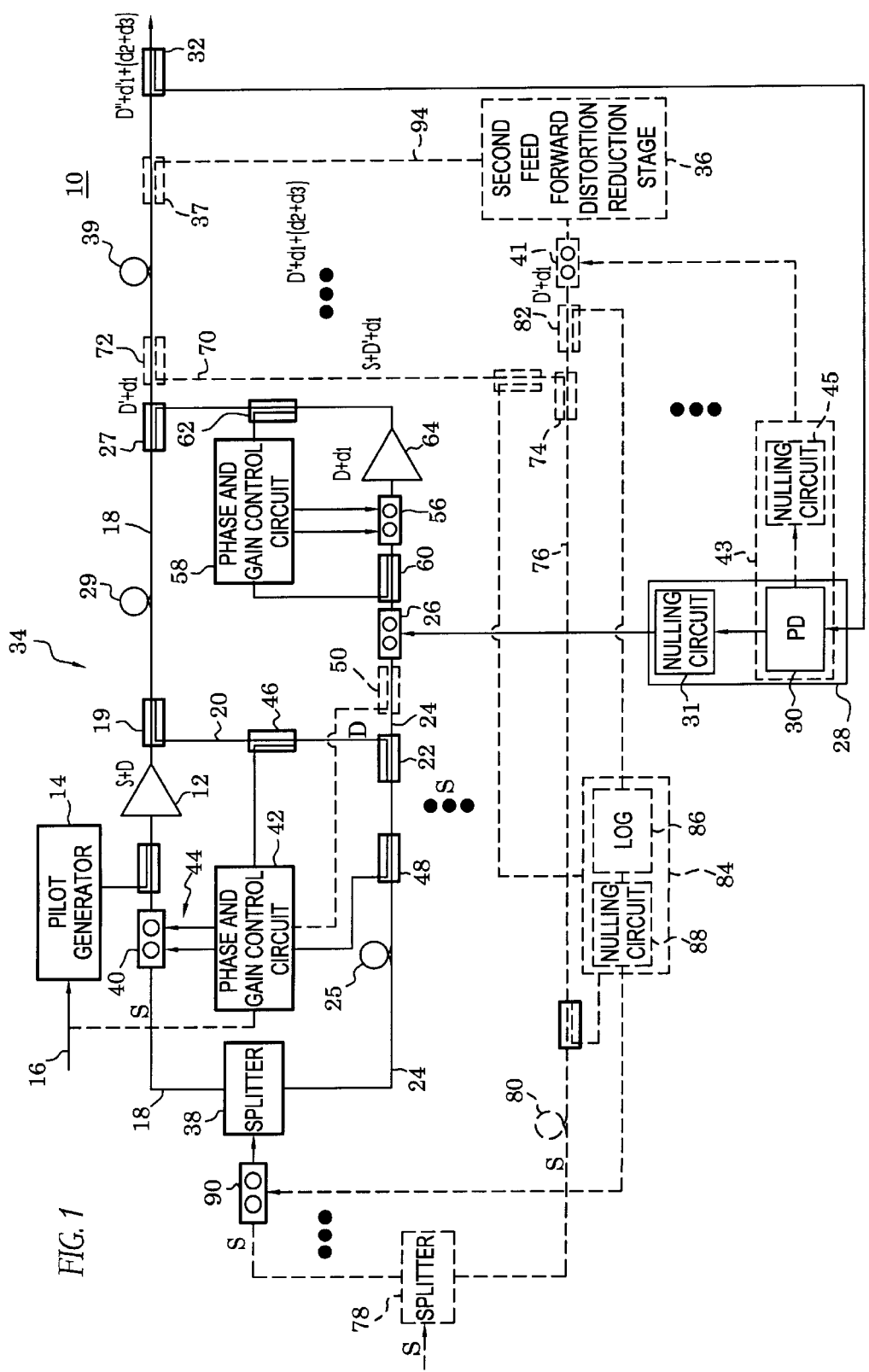
FIG. 1 shows a general block diagram of a calibration system according to the principles of the present invention for a pilotless feed forward distortion reduction system.

An illustrative embodiment of a calibration system for a pilotless feed forward distortion reduction system according to the principles of the present invention is described below. FIG. 1 shows a general block diagram of a feed forward distortion reduction system 10 which does not use a pilot signal to reduce the distortion from the output of an amplifier 12, such as a radio frequency (RF) amplifier. The operation of the pilotless feed forward distortion reduction system 10 can degrade as the operational characteristics of components change due to aging, temperature and other reasons, and because the system 10 is pilotless, some of these operational changes may not be compensated. To compensate for changing operational characteristics of the feed forward distortion reduction system 10, the calibration system uses a pilot generator 14 which can be activated by a control signal 16. The pilot generator 14 can be generated when no signal S is present on a main signal path 18 or other paths carrying a version of the signal S. Alternatively, the pilot signal can be generated when other criteria is met.

Once generated, the pilot signal is injected into the main signal path 18 before the amplifier 12. A portion of the amplified pilot signal from the amplifier 12 is coupled from the main signal path 18 using a coupler 19 and placed on a coupling path 20. From the coupling path 20, a coupler 22 couples the pilot signal from the coupling path 20 onto a feed forward path 24. The pilot signal is fed forward on the feed forward path 24 to combine with the pilot signal on the main signal path 18. In this embodiment, the output of the coupler 22 is applied to a gain & phase adjuster 26 which adjusts the phase and/or amplitude of the signal on the feed forward path 24. When the feed forward reduction system 10 is being calibrated, the gain & phase adjuster 26 is calibrated to provide gain and/or phase adjustments according to phase and/or gain control signals provided from a gain and phase calibration circuit 28. The phase and gain control circuit 28 provides the phase and/or gain adjustment signals in response to a sample of the pilot signal taken by a coupler 32 on the main signal path 18 at the output of the feed forward distortion reduction system 10.

The phase and/or gain calibration circuit 28 adjusts the phase and/or gain provided by the adjuster 26 to adjust the relative phase and/or gain between signal on the signal path 18 and the feed forward path 24 to improve the cancellation of the pilot signal at the coupler 27. The cancellation at the coupler 27 may have degraded due to changing operating characteristics of devices on the path 18 after the amplifier 12, such as a delay 29. To determine the desired phase and/or amplitude adjustments, the phase and gain control circuit 28 receives a sample of the pilot signal after the coupler 27. In certain embodiments, the gain and phase control circuit 28 can include a pilot detector 30, such as a logarithmic detector, and a nulling circuit 31. The coupler 32 produces a sample of the signal after the output of the coupler 27 to the pilot detector 30 which produces a signal indicative of the amplitude of the pilot signal. The nulling circuit 31 attempts to reduce the signal from the pilot detector 30, thereby improving the cancellation at the coupler 27, by providing phase and/or gain adjustment signals to the phase and gain adjuster 26. To provide cancellation of the pilot signals at the coupler 27, the pilot signal on the main signal path 18 should combine with the pilot signal on the feed forward path 24 at equal amplitudes and 180 degrees out of phase. Depending on the embodiment, a 2 dB amplitude difference and a 175–185 degree phase difference between the combining signals may be sufficient.

The feed forward distortion reduction system 10 includes a first feed forward distortion reduction stage 34 which itself can be referred to as a pilotless feed forward distortion system using the calibration system according to the principles of the present invention. The feed forward reduction system 10 can include a second feed forward distortion reduction stage 36 shown in dashed lines as well as additional stages (not shown). The second feed forward distortion reduction stage 36 is used to feed forward the distortion produced from the first stage 34 to further reduce the distortion from the main signal path 18. A coupler 37 on the main signal path 18 combines the distortion signal from the second feed forward stage 36 and a delayed version of the signal with distortion from the first feed forward stage 34 on the main signal path 18 to reduce the distortion from the main signal path 18. The signal with distortion on the main signal path 18 is delayed by a delay 39. Devices on the main signal path 18, such as the delay 39, can degrade the cancellation of the distortion at the coupler 37.

To calibrate the feed forward distortion reduction system 10 with a second stage 36, a gain & phase adjuster 41 is located at the input to the second feed forward stage 36. The gain and phase adjuster 41 is calibrated to provide gain and/or phase adjustments according to phase and/or gain control signals provided from a gain and phase calibration circuit 43. The phase and gain control circuit 43 provides the phase and/or gain adjustment signals in response to a sample of the pilot signal taken by the coupler 32 on the main signal path 18 at the output of the feed forward distortion reduction system 10. In this embodiment, the phase and/or gain calibration circuit 43 adjusts the phase and/or gain provided by the adjuster 41 to improve the cancellation of the pilot signal at the coupler 37. The cancellation at the coupler 37 may have degraded due to changing operating characteristics of devices on the path 18 after the amplifier 12, such as the delay 39. In this embodiment, the gain and phase control circuit 43 includes the pilot detector 30 of the pilot calibration circuit 28 and a nulling circuit 45. The coupler 32 produces a sample of the signal after the output of the coupler 37 to the pilot detector 30 which produces a signal indicative of the amplitude of the pilot signal. The nulling circuit 45 attempts to reduce the signal from the pilot detector 30, thereby improving cancellation at the coupler 37, by providing phase and/or gain adjustment signals to the phase and gain adjuster 41.

In other embodiments, the phase and gain calibration circuit 43 includes a separate pilot detector (not shown), such as another logarithmic detector, receiving a sample of the pilot signal on the main signal path after the output of the coupler 37. In yet other embodiments, the phase and gain detector 28 receives a sample of the signal on the main signal path 18 after the coupler 27 but before the delay 39, and the phase and gain detector 43 receives the signal from the coupler 32. To provide cancellation of the pilot signals at the coupler 27, the pilot signal on the main signal path 18 should combine with the pilot signal on the feed forward path 24 at equal amplitudes and 180 degrees out of phase. Depending on the embodiment, a 2 dB amplitude difference and a 175–185 degree phase difference between the combining signals may be sufficient.

Additional embodiments are possible which make phase and/or gain adjustments in various locations, such as prior to signal combination points, in the system based on pilot signal measurements at various locations, such as after the signal combination points. Furthermore, additional feed forward distortion reduction stages (not shown) can be added and calibrated according to the principles of the present invention as would be understood by one of skill in the art with the benefit of this disclosure.

During normal operation, the feed forward distortion reduction stage 34 receives from a splitter 38 a signal S to be amplified on the main signal path 18 and replicates the signal S onto the main signal path 18 and the feed forward path 24. The signal S on the main signal path 18 is applied to a gain & phase circuit 40. The output of gain & phase circuit 40 is applied to the amplifier 12 whose output comprises the amplified input signal S with distortion D produced by the amplifier 12. A portion of the output S and D of the amplifier 12 is placed on the coupling path 20 and combined at the coupler 22 with a delayed version of the signal S on the path 24 to isolate the distortion D produced from the amplifier 12. A delay 25 delays the signal S, so corresponding portions of the signals S can combine at the coupler 22. The delay 25 may be on the order of nanoseconds.

The gain & phase circuit 40 is controlled by a phase and gain controller 42 to adjust the gain and phase of the signal S on the main signal path 18 prior to the amplifier 12 such that the amplified signal S and D at the coupler 22 is substantially the inverse (equal in amplitude but 180° out of phase) of the delayed signal S on the path 24. In some embodiments, the gain and phase control circuit 42 provides control signal(s) on the control path(s) 44 of the gain & phase circuit 40 derived from the portion of the amplified signal S and D on the coupling path 20 provided by a coupler 46 and the delayed version of the signal S on the path 24 provided by a coupler 48, as described in the patent application entitled "Pilotless Feed Forward Distortion Reduction System" filed concurrently with this application and assigned to the same assignee and herein incorporated by reference. Because the desired amplitude and phase relationship (for example, the combining signals have the same amplitude and are 180 degrees out of phase) is maintained between the combining signals, the combining signals S sufficiently cancel to isolate the distortion D at the coupler 22. In other embodiments, the gain and phase control circuit 42 can be a logarithmic detector and a nulling circuit. In such an embodiment, a coupler 50 produces a sample of the signal after the output of the coupler 22 to the log detector which produces a signal indicative of the amplitude of the signal. A nulling circuit attempts to reduce the signal from the log detector to improve cancellation of the signal and isolate the distortion after the coupler 22 by providing control signals 44 to the phase and gain adjuster 40.

In either case, the phase and gain control circuit 42 or a distinct calibration controller (not shown) can use the samples from the couplers 46, 48 and/or 50 or others to determine if there is a signal S present within the feed forward distortion reduction system 10. If the signal S is not present, the phase and gain controller 42 (or calibration controller) can provide a calibration activation signal to the pilot signal generator 14 to activate the pilot signal calibration system. Once the calibration is complete, the pilot generator 14 can be deactivated. If there is signal S present, the phase and gain control circuit 42 adjusts the phase and gain of the phase and gain circuit 40 to provide cancellation of the signals S at the coupler 22.

As the cancellation of the combining signals S improves, the feed forward distortion reduction system 10 improves the isolation of the distortion D on the feed forward path 24 at the coupler 22. The feed forward distortion reduction stage 34 feeds forward the isolated distortion D on the path 24 to reduce the distortion D on the main signal path 18. As such, the improved isolation of the distortion D at the coupler 22 can lead to improving the reduction of the distortion D from the output of the stage 34 at the coupler 27. In this embodiment, the output of the coupler 22 is applied to gain & phase adjuster 26 then to phase and gain adjuster 56 which adjusts the signal D according to phase and gain control signals from a gain and phase control circuit 58. The phase and gain control circuit 58, such as an automatic gain and phase control circuit as described in the patent application entitled "Feed Forward Amplifier Improvement Incorporating An Automatic Gain and Phase Controller" filed concurrently with the present application and assigned to the same assignee and herein incorporated by reference, provides the gain and phase control signals in response to inputs received from the couplers 60 and 62. The coupler 60 is on the path 24 prior to an amplifier 64, and the coupler 62 is located after the amplifier 64.

The output of gain and phase adjuster 56 is applied to the amplifier 64 whose output comprises the amplified signal D and distortion signals $d_1$ produced by the amplifier 64. The stage 34 is designed such that corresponding portions of the signals D applied to a coupler 52 destructively combine to produce at the coupler 27 the amplified signal S with reduced distortion D' (and distortion $d_1$).

As mentioned above, tight tolerances are required in the performance of the stage 64 to achieve a 30 dB reduction in the distortion. Long term aging and other factors can lead to changes in the operating characteristics of the feed forward distortion reduction system 10. Since a pilot signal is not used to reduce distortion from the signal S on the main signal path 18, some of these changes are not inherently compensated, thereby leading to as degradation in performance. For example, over time, the devices on the main signal path 18, such as the delay 29, can change in operation over time which degrades system performance. The pilot signal calibration system can be triggered to calibrate the feed forward reduction system by making phase and gain adjustments to the system 10 in response to measurements of the pilot signal at the output of the system 10.

If the goal is changed from a 30 dB reduction of the distortion at the output of the stage 34 at the coupler 27 to a 20 or 25 dB reduction in the distortion at the output of the stage 34, the tolerances need not be so tight. In certain embodiments, the distortion reduction system uses multiple pilotless feed forward reduction stages according to the principles of the present invention to further reduce the distortion from the output of the RF amplifier 62. As such, the pilot signal calibration system can make additional adjustments and measurements of the pilot signal to calibrate the additional stages, such as the second feed forward distortion reduction stage 36.

During normal operation, the second feed forward reduction stage 36 receives the reduced distortion D' and any additional distortion d1 from the first feed forward reduction stage 34 from coupler 74. A coupler 72 couples a portion of the signal S with distortion D' and d1 from the main signal path 18 onto the second coupling path 70. The coupler 74 receives the signal S with distortion D' and $d_1$ from the coupling path 70 and combines the signal S and the distortion D' and $d_1$ from the coupling path 70 with a delayed signal S on a path 76 which was obtained from splitter 78. In this embodiment, the splitter 78 receives the input signal S and provides versions of the input signal S to the splitter 38 of the first feed forward stage 34 and the path 76. The input signal S on the path 76 is delayed by a delay 80. The signal S on the path 76 experiences sufficient delay provided by the delay circuit 80 such that signal S experiences the same delay as the signal S appearing at the coupler 74 via the path 70. The coupler 74 destructively combines the signal S from the second coupling path 70 and the signal S from the path 76 and isolates the remaining distortion D' and $d_1$ from the first feed forward arrangement 34 on the path 76 leading to the second feed forward arrangement 36.

To improve the cancellation of the signal S to leave the distortion D' and d1 from the first feed forward stage 34, a coupler 82 obtains a portion of any remaining signal S with the distortion D' and d1 and provides the signal to a gain and phase control circuit 84. In this embodiment, the gain and phase control circuit 84 can be a logarithmic detector 86 and a nulling circuit 88. The coupler 82 produces a sample of the signal after the output of the coupler 74 to the log detector 86 which produces a signal indicative of the amplitude of the sample. The nulling circuit 88 attempts to reduce the signal from the log detector 86 to improve cancellation of the remaining signal S and isolate the distortion D' and d1 after the coupler 82 by providing control signals to a phase and gain adjuster 90 at the input to the first feed forward arrangement 34. In alternative embodiments, the gain and phase control circuit 84 provides control signal(s) to the gain & phase circuit 90 derived from the portion of the amplified signal S and D on the coupling path 70 and a delayed version of the signal S on the path 76, as described in the patent application entitled "Pilotless Feed Forward Distortion Reduction System" filed concurrently with this application and assigned to the same assignee.

The second feed forward stage can be configured to operate as described above for the first feed forward stage 34. The second feed forward stage 36 receives the distortion produced from the first feed forward stage 34 and produces an amplified version of D and d1 which is fed forward to further reduce the distortion D' and d1 from the amplified signal S on the main signal path 18. Accordingly, at the output 94 of the second feed forward stage 36, an amplified distortion signal D and $d_1$ (as well as any minor distortion signals introduced by the amplifiers (not shown) in the second feed forward stage 66) are provided to the coupler 37. The coupler 37 combines the distortion signals D' and $d_1$ from the second feed forward stage 36 with a delayed version of the signals S with distortion D' and $d_1$ on the main signal path 18 to further reduce the distortion D' produced from the first feed forward stage 34 as well as the residual distortion $d_1$.

In addition to the embodiments described above, alternative configurations of the calibration system and the multiple feed forward distortion reduction system are possible which omit and/or add components and/or use variations or portions of the described system. For example, the calibration system and the distortion reduction system are described as using couplers and splitters, but other devices, such as 3 dB splitters and other coupling, signal splitting or sampling devices, can be used as well as other combining devices, such as summers. The splitters and/or couplers are sometimes described as replicating a signal on two paths, but it should be understood that the signals need not be replicas. Furthermore, for discussion purposes, the feed description of the forward distortion reduction system refers to signal S and D in different places. This does not mean that corresponding signals in different locations are the same, for example the signal S before the amplifier 12 does not have the same amplitude as the amplified signal S, but the signal S is the signal of interest although of different amplitude in this example.

Additionally, the feed forward distortion reduction system is described with variable gain and phase adjusters controlled by phase and gain control circuits. Depending on the application, the gain and/or phase adjusters can be fixed and/or variable, and their location in the feed forward arrangements can change. As such, the positioning of the pilot calibration system would also change as would be understood by one of skill in the art with the benefit of this disclosure. Furthermore, the calibration system pilot according to the principles of the present invention can use a continuous wave (CW) pilot, a spread spectrum pilot, a modulated pilot, a pulsed pilot, a pilot of varying frequency, or a pilot having different frequency components. The feed forward system has been further described as using different configurations of discrete components, but it should be understood that the calibration system and portions thereof can be implemented in application specific integrated circuits, software-driven processing circuitry, firmware or other arrangements of discrete components as would be understood by one of ordinary skill in the art with the benefit of this disclosure. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

What is claimed is:

1. A method of calibrating a feed forward distortion reduction system, said method comprising the steps of:

injecting periodically a calibration pilot signal onto a main signal path;

obtaining a portion of said calibration pilot signal on a feed forward path;

combining said calibration pilot signal on said main signal path with said calibration pilot signal on said feed forward path; and adjusting the relative phase and amplitude between said portion of said calibration pilot signal on said feed forward path and said calibration pilot signal on said main signal path based on said calibration pilot signal on said main signal path after said step of combining.

2. The method of claim 1 further including the step of:

amplifying said pilot signal on said signal path prior to said step of obtaining.

3. The method of claim 2 wherein said step of adjusting includes:

adjusting said phase and amplitude of said pilot signal on said feed forward path based on said pilot signal on said signal path after said step of combining.

4. The method of claim 3 wherein said step of adjusting includes:

adjusting said phase and amplitude of said pilot signal on said feed forward path to reduce said pilot signal on said signal path after said step of combining.

5. The method of claim 1 further including the steps of:

obtaining a portion of said pilot signal after said step of combining to a second feed forward path;

combining said pilot signal on said signal path with said pilot signal on said second feed forward path; and adjusting the relative phase and amplitude between said portion of said pilot signal on said feed forward path and said pilot signal on said signal path based on said pilot signal on said signal path after said second step of combining.

6. The method of claim 5 wherein said step of adjusting includes:

adjusting said phase and amplitude of said pilot signal on said second feed forward path based on said pilot signal on said signal path after said second step of combining.

7. The method of claim 1 wherein said step of injecting includes:

injecting said pilot signal on said main signal path when no signal is on said signal path.

8. A calibration system for a distortion reduction system comprising:

a pilot generator coupled to a main signal path for periodically injecting a calibration pilot signal in said main signal path prior to amplification of said calibration pilot signal by an amplifier;

a coupling arrangement that obtains a portion of the amplified calibration pilot signal and provides said amplified calibration pilot signal onto a feed forward path;

a combining device on said signal path that receives said calibration pilot signal on said signal path and said amplified calibration pilot signal on said feed forward path and combines said calibration pilot signal on said main signal path and said amplified calibration pilot signal on said feed forward path; and a gain and phase circuitry configured to adjust the relative phase and gain between said calibration pilot signal on said main signal path and said calibration pilot signal on said feed forward path based on said calibration pilot signal on said main signal path after said combining device.

9. The system of claim 8 wherein said gain and phase circuitry includes a gain and phase adjuster on said feed forward path for adjusting the phase and amplitude of said pilot signal on said feed forward path based on said pilot signal on said signal path after said combining device.

10. The system of claim 9 wherein said gain and phase circuitry adjusts said phase and amplitude of said pilot signal on said feed forward path to reduce said pilot signal on said signal path after said combining device.

11. The system of claim 9 further including:

a second coupling arrangement obtaining a portion of said pilot signal after said combining device to provide remaining pilot signal to a second feed forward path;

a second combining device on said signal path after said combining device combines said pilot signal on said signal path with said pilot signal on said second feed forward path; and said phase and gain circuitry configured to adjust the relative phase and amplitude between said portion of said pilot signal on said feed forward path and said pilot signal on said signal path based on said pilot signal on said signal path after said second combining device.

12. The system of claim 11 wherein said phase and gain circuitry includes a phase and gain adjuster on said feed forward path to adjust said phase and amplitude of said pilot signal on said second feed forward path based on said pilot signal on said signal path after said second combining device.

13. The system of claim 9 comprising a calibration activation device configured to inject said pilot signal on said main signal path when no signal is on said signal path.

* * * * *